United States Patent [19]
Gates

[11] Patent Number: 6,028,355
[45] Date of Patent: Feb. 22, 2000

[54] METHOD AND APPARATUS FOR DISSIPATING HEAT FROM AN ENCLOSED PRINTED WIRING BOARD

[75] Inventor: Frank Vernon Gates, Roxbury Township, N.J.

[73] Assignee: AT&T Corp., New York, N.Y.

[21] Appl. No.: 09/097,971

[22] Filed: Jun. 16, 1998

[51] Int. Cl.[7] .................................................. H01L 23/36
[52] U.S. Cl. ........................ 257/706; 257/723; 257/712
[58] Field of Search ................................ 257/712–718, 257/719, 722, 706

[56] References Cited

U.S. PATENT DOCUMENTS

| | | | |
|---|---|---|---|
| 4,939,570 | 7/1990 | Bickford et al. | 257/722 |
| 5,262,927 | 11/1993 | Chia et al. | 257/707 |
| 5,387,815 | 2/1995 | Nishiguchi | 257/719 |
| 5,525,835 | 6/1996 | Nishiguchi | 257/719 |
| 5,583,377 | 12/1996 | Higgins, III | 257/722 |

OTHER PUBLICATIONS

"Microelectronics Packaging Handbook" Semiconductor Packaging, Part II, Second Edition; R.R. Tummala, E.J. Rymaszewski, A.g. Klopfenstein; Chapman & Hall, International Thomson Publishing (1977); pp. II63–II64, II–117.

*Primary Examiner*—David Hardy
*Attorney, Agent, or Firm*—Morgan & Finnegan, L.L.P.; Christopher J. Hamaty

[57] ABSTRACT

A housing encloses a multi-layer printed wiring board. A set of mounting heat sinks is fitted through the housing and contacts the multi-layer printed wiring board. The set of mounting heat sinks dissipates heat from the printed wiring board and is used to mount the printed wiring board to a wall.

12 Claims, 1 Drawing Sheet

METHOD AND APPARATUS FOR DISSIPATING HEAT FROM AN ENCLOSED PRINTED WIRING BOARD

BACKGROUND OF THE INVENTION

1. Field of the Invention

This invention relates to dissipating heat from an enclosed printed wiring board.

2. Description of the Related Art

One common process for definition of signal traces on printed wiring boards is known as a subtractive process. In this process a panel consisting of a copper clad dielectric material is coated with a photoimagable polymer (photoresist). A phototool containing a negative image (clear traces with a black background) of the signal trace layer to be formed is placed over the photoresist coated panel and ultraviolet (UV) light is used to expose and crosslink the photoresist through the clear areas in the phototool, which correspond to the subtractive signal image. Unexposed areas of the photoresist are then removed in a developer solution. The traces are then defined in the copper by exposing the panel to a copper etching solution, where the photoresist acts to protect the copper beneath it while the remaining copper is removed. The photoresist is then removed to complete the process.

A multi-layer printed wiring board typically includes several non-conductive layers of epoxy (a dielectric), several plated-on layers on each side of the dielectric, with spacer layers ("spacers") in between. Traces are etched in each layer to make the various interconnects. One of the many layers of the multi-layer printed wiring board is typically for power while another layer is for ground. The other (non-power and ground) layers are typically thinner and have narrower traces than the power layer or the ground layer.

Increases in semiconductor chip input/output (I/O) lead count in high-performance computers and other systems, and the shrinking size of consumer and automotive electronics are driving the increased wiring density of integrated circuits defined in single and multi-chip packages and printed wiring boards. See *Microelectronics Packaging Handbook*, 2nd edition, pp. II-63, II-64, and II-117 (1997) by Tummala, Rymaszewski, and Klopfenstein.

To achieve increased wiring density, the signal traces on multi-layer printed wiring boards, and the spaces between the signal traces, are becoming narrower. In such high-density high I/O printed wiring boards, more pin-outs project from each integrated circuit and from all of the integrated circuits than in past practice. On a standard high-density high I/O printed wiring board there can be as many as one hundred integrated circuits, each with fifty to one hundred (or more) leads or pin-outs. As trace widths become narrower, the power density on both the integrated circuits and the printed wiring boards is increasing.

In standard printed wiring boards with standard integrated circuits and standard heat sinks, heat is removed from the board into the interior of a housing. For conventional electronic devices, heat dissipation is commonly performed by permanently attaching a heat sink to an integrated circuit to remove heat generated by operating integrated circuits. Such a heat dissipation technique often results in costly custom modification of the integrated circuit and/or printed wiring board to maximize heat dissipation.

Traditional bosses are ordinarily molded into a plastic housing containing the printed wiring board in order to mount the wiring board.

Flexibility in the design of the electronic device is greatly reduced, and manufacturing costs are increased, if the design of the electronic device or integrated circuit depends on the configuration or characteristics of the housing. As such, there continues to be a need for a heat dissipation technique that does not interfere with design or mounting of the printed wiring boards.

SUMMARY OF THE INVENTION

It is an object of the invention to efficiently dissipate heat from an enclosed printed wiring board without having to customize the design of integrated circuits or the printed wiring board.

It is an another object of the invention to create an apparatus for efficiently removing heat from an enclosed printed wiring board through passive means without affecting the physical design integrity of the printed wiring board.

According to an exemplary embodiment of the invention, a housing encloses a multi-layer printed wiring board. A set of mounting heat sinks is fitted through the housing and contacts the multi-layer printed wiring board. The set of mounting heat sinks dissipates heat from the printed wiring board and is used to mount the printed wiring board.

According to an aspect of the invention, heat is dissipated from an enclosed printed wiring board by enclosing a multi-layer printed wiring board in a housing, and fitting a set of mounting heat sinks through the housing such that the set of mounting heat sinks contacts the multi-layer printed wiring board.

Other features and advantages of the invention will become apparent from the following detailed description, taken in conjunction with the accompanying drawings, which illustrate, by way of example, the features of the invention.

DETAILED DESCRIPTION

Figure 1:
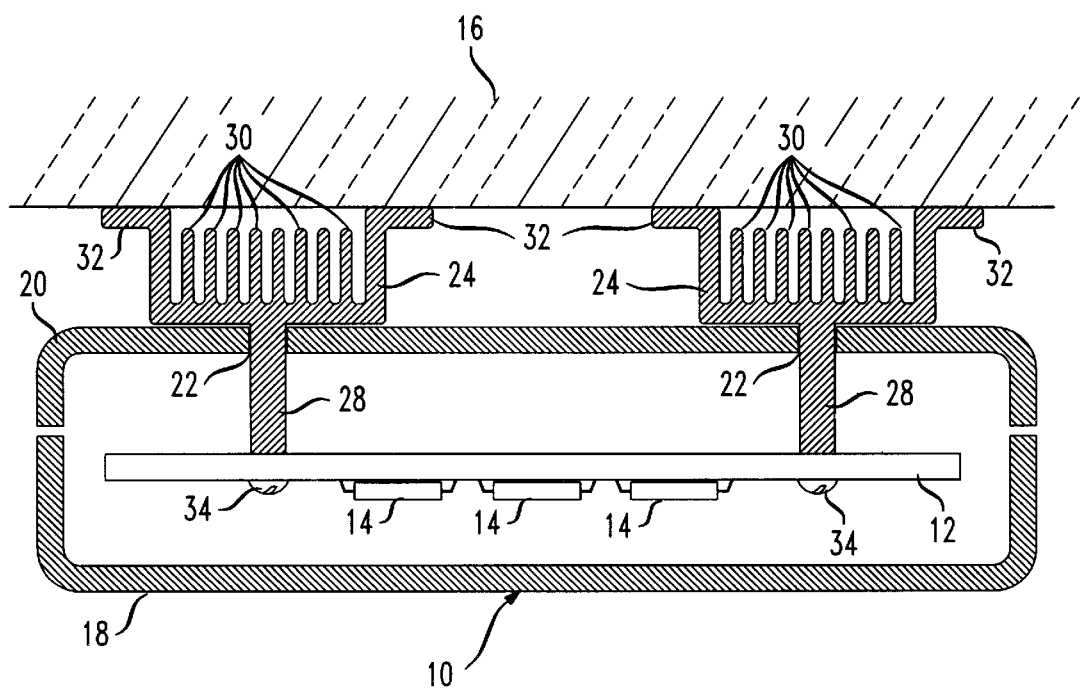
FIG. 1 is a plan sectional view of an apparatus for dissipating heat from an enclosed printed wiring board in accordance with the principles of the invention.

For conventional electronic devices, heat dissipation is commonly performed by permanently attaching a heat sink to an integrated circuit to remove heat generated by the integrated circuits. Forced customization of the design of the electronic device or integrated circuit in order to dissipate heat from the wiring board reduces design flexibility and increases manufacturing costs. According to the invention, a plurality of strategically placed heat sinks is removably integrated with the housing apparatus used to mount the wiring board. The heat sinks efficiently draw heat away from the wiring board without materially changing the design of the wiring board.

As shown in the drawings for purposes of illustration, a housing encloses a multi-layer printed wiring board. One or more mounting heat sinks are fitted through the housing making contact with the multi-layer printed wiring board. The one or more mounting heat sinks dissipate heat from the printed wiring board and can be used to mount the printed wiring board to a wall. These and other features of the preferred embodiment of the invention will become more fully apparent with reference to the drawings.

FIG. 1 shows a plan sectional view of an apparatus designed to dissipate heat from an enclosed printed wiring board. With reference to FIG. 1, the apparatus includes a housing 10 enclosing a multi-layer printed wiring board 12. A plurality of integrated circuit components 14 are defined in or attached to a surface of the multi-layer printed wiring board 12.

The apparatus can be mounted, for example, to a wall 16 in a corridor of a building. The printed wiring board 12 contains circuitry designed for the intended application, such as, for example, a fire alarm. An aesthetically appropriate housing can be selected to encase the printed wiring board. Exemplary dimensions of a printed wiring board for a fire alarm application are ten (10) inches high and eighteen (18) inches wide.

The housing 10 includes a front housing section 18 and a rear housing section 20 in confronting relation with the front housing section 18. The front housing section 18 and the rear housing section 20 cooperate to enclose the multi-layer printed wiring board 12 therebetween.

The housing 10 includes one or more holes 22 defined by the rear housing section 20 having a circular shape through which a cylindrical member can be fitted. A set of mounting heat sinks 24 are fitted through the holes 22 of the rear housing section 20. The mounting heat sinks 24 are die-cast metal. Each of the set of mounting heat sinks presents a proximal end disposed substantially within the housing 10 and a distal end disposed substantially externally of the housing 10. Each mounting heat sink 24 includes a cylindrically-shaped stub 28 at the proximal end thereof and an array of fins 30 and one or more foot-shaped brackets 32 at the distal end thereof Each stub 28 extends through a hole 22 in the rear housing section 20 and contacts a rear face of the multi-layer printed wiring board 12. The stub 28 is fastened to the printed wiring board 12 by a suitable fastener, such as a bolt 34 or screw which passes through the printed wiring board 12 and threadingly engages the stub 28.

The array of fins 30 at the distal end of each mounting heat sink 24 dissipates heat into the air by convection. The one or more foot-shaped brackets 32 at the distal end of the mounting heat sink 24 are adapted to be fastened to a wall 16, whereby the housing 10 enclosing the multi-layer printed wiring board 12 can be mounted to the wall 16. For example, a key hole arrangement that is adapted to receive and mate with a shouldered bolt attached to the wall can be cast into the foot-shaped bracket.

A multiplicity of mounting heat sinks 24 are strategically placed to conduct heat from the printed wiring board 12, outward of the housing 10, to the array of fins 30 at the distal end of the mounting heat sink 24 in accordance with the principles of the invention. The fins are optimized to promote free convection.

Modern high density/high power integrated circuits have a large number of pin-outs. The pin-outs make excellent heat conduction paths from the integrated circuits to the copper traces on the printed wiring board. Many layers of copper traces interconnect the hundreds of pin-outs on each integrated circuit to the other hundreds of integrated circuits on the printed wiring board. The layers of copper traces include a power distribution layer, a ground distribution layer, and other layers reserved for signal interconnections. The layers used for signal interconnections are relatively thin with respect to the power distribution layer and the ground distribution layer, and have closely spaced traces which better facilitate signal connectivity and required wiring board resolution.

If the conductive resistance of the stub of the mounting heat sink is large, the stub could be made to incorporate a heat pipe. Heat pipes are sealed hollow tubes of copper filled with alcohol or other fluid at low vapor pressure, which gives them the ability to transfer significant amounts of heat along their length with minimal temperature differential. Heat pipes can be attached to individual integrated circuits populated on a printed wiring board to dissipate heat from the integrated circuits. Heat pipes are used, for example, in laptop computers.

The high pin count associated with modem integrated circuits enhances thermal conduction from the components of the board. Providing additional copper layers or thickening and widening some of the copper layers of the multi-layer printed wiring board enhances thermal conduction from the components of the board. Converting the stub at the proximal end of the mounting heat sink into a heat pipe allows more heat to be dissipated from the integrated circuits through the stub to the array of fins at the distal end of each mounting heat sink.

Figure 2:
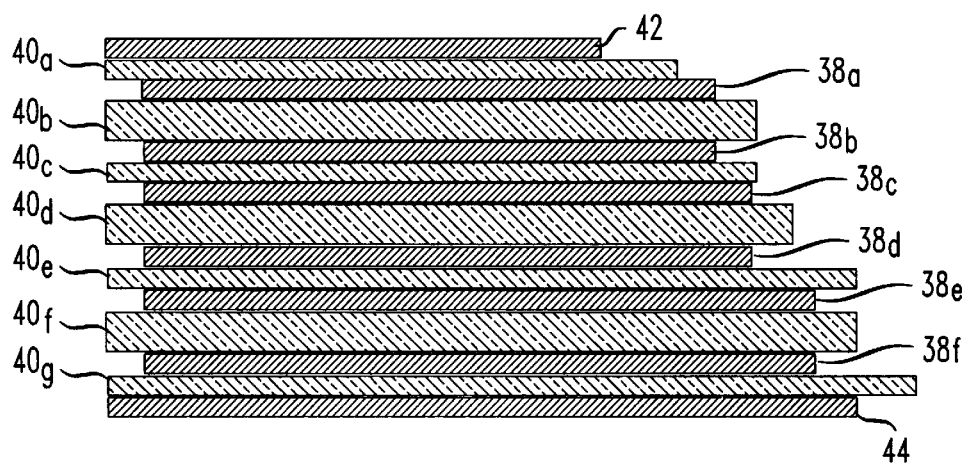
FIG. 2 is a side view of a multi-layer printed wiring board in accordance with the principles of the invention.

FIG. 2 is a side elevational view of a multi-layer printed wiring board in accordance with a specific embodiment of the invention. With respect to FIG. 2, the exemplary multi-layer printed wiring board contains fifteen layers, including eight layers of traces. The fifteen layers illustrated in FIG. 2 include six 0.0015 inch-thick copper plated foil signal layers 38a–38f, seven dielectric layers 40a–40g, and two 0.007-inch thick copper layers 42, 44. Layers 42, 44 are used to interconnect each integrated circuit to electrical power and electrical ground.

Layers 42, 44 are used to minimize voltage drop, and also function as heat spreaders which minimize thermal peaks near integrated circuits. Making the power and ground layers much thicker than actually necessary for proper circuit operation as taught herein improves heat spreading beyond the capability of previous practice. The heat spreading properties associated with the power and ground layers of modern composite-layer printed wiring boards are utilized according to the principles of the invention.

In the printed wiring board illustrated in FIG. 1, the integrated circuits 14 generate heat. The mounting heat sinks 24 are strategically joined to the housing 10. Heat is conducted along the copper traces of the copper layers of the printed wiring board 12 into the mounting heat sinks 24. Although the power layer and the ground layer preferably have a copper thickness greater than the other layers, the copper layers dissipate heat whether or not some of the layers are thicker or thinner than others. The copper traces spread the heat to the mounting heat sinks 24, which conduct the heat to the exterior of the housing according to the principles of the invention.

The mounting heat sink 24 transfers heat away from the printed wiring board more efficiently than a conventional plastic housing with a customized filling agent for dissipating heat. The mounting heat sink 24 is removably integrated with the housing and passively removes heat away from the printed wiring board 12 without affecting the physical design integrity of the printed wiring board or any populated integrated circuits.

Materials from which the conductive layers are made can include copper, gold, silver, platinum, nickel or combinations thereof.

While several particular forms of the invention have been illustrated and described, it will also be apparent that various modifications can be made without departing from the spirit and scope of the invention.

What is claimed is:

1. An apparatus, comprising:

a housing enclosing a multi-layer printed wiring board;

a mounting heat sink fitted through the housing and contacting the multi-layer printed wiring board;

the mounting heat sink dissipates heat from the printed wiring board and is used for mounting the printed wiring board; and an integrated circuit component defined on the multi-layer printed wiring board.

2. The apparatus of claim 1, wherein:

the multi-layer printed wiring board having at least one layer composed of copper traces, wherein the at least one layer is substantially thicker than the other layers of the multi-layer printed wiring board.

3. An apparatus, comprising:

a housing enclosing a multi-layer printed wiring board;

a mounting heat sink fitted through the housing and contacting the multi-layer printed wiring board;

the mounting heat sink dissipates heat from the printed wiring board and is used for mounting the printed wiring board; and the housing includes a front housing section in confronting relation with a rear housing section.

4. The apparatus of claim 3, wherein:

the front housing section and the rear housing section enclose the multi-layer printed wiring board.

5. The apparatus of claim 3, further comprising:

one or more holes defined by the rear housing section.

6. An apparatus, comprising:

a housing enclosing a multi-layer printed wiring board;

a mounting heat sink fitted through the housing and contacting the multi-layer printed wiring board;

the mounting heat sink dissipates heat from the printed wiring board and is used for mounting the printed wiring board;

the mounting heat sink has a proximal end and a distal end;

a stub at the proximal end;

an array of fins at the distal end; and one or more brackets at the distal end adapted to be fastened to a wall.

7. The apparatus of claim 6, wherein:

the stub extends through a hole defined by the housing and contacts a rear face of the multi-layer printed wiring board.

8. The apparatus of claim 7, wherein:

the stub is fastened to the multi-layer printed wiring board.

9. The apparatus of claim 6, wherein:

the array of fins dissipates heat into the air by convection.

10. The apparatus of claim 6, wherein:

the housing is mounted to a wall.

11. An apparatus, comprising:

a housing enclosing a multi-layer printed wiring board;

a mounting heat sink fitted through the housing and contacting the multi-layer printed wiring board;

the mounting heat sink dissipates heat from the printed wiring board and is used for mounting the printed wiring board; and the multi-layer printed wiring board includes multiple dielectric cores and conductive layers.

12. The apparatus of claim 11, wherein the conductive layers include:

a first layer having a first thickness, and a second layer having a second thickness;

wherein the first thickness is greater than the second thickness.

\* \* \* \* \*